(12) United States Patent
Baars et al.

(10) Patent No.: US 8,735,232 B2
(45) Date of Patent: May 27, 2014

(54) METHODS FOR FORMING SEMICONDUCTOR DEVICES

(75) Inventors: Peter Baars, Dresden (DE); Matthias Goldbach, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 360 days.

(21) Appl. No.: 13/306,702

(22) Filed: Nov. 29, 2011

(65) Prior Publication Data

US 2013/0137234 A1 May 30, 2013

(51) Int. Cl.
*H01L 21/00* (2006.01)
*H01L 21/336* (2006.01)

(52) U.S. Cl.
USPC ............ 438/157; 438/149; 438/294; 438/289

(58) Field of Classification Search
USPC ......... 438/149, 157, 266, 289, 294, 296, 368; 257/E21.19, E21.144, E21.409, 257/E21.546
See application file for complete search history.

(56) References Cited

U.S. PATENT DOCUMENTS

2010/0072550 A1    3/2010  Matsuo
2013/0065371 A1*   3/2013  Wei et al. ...................... 438/294

OTHER PUBLICATIONS

German Patent Application No. 102011004506.6 filed Feb. 22, 2011.
German Patent Application No. 10 2010 029 527.2 filed May 31, 2011.
German Patent Application No. 102011004323.3 filed Feb. 17, 2011.
U.S. Office Action mailed Oct. 22, 2012 in related U.S. Appl. No. 13/231,750.
USPTO, Notice of Allowance mailed Jun. 17, 2013 in U.S. Appl. No. 13/231,750.
USPTO, Final Office Action for U.S. Appl. No. 13/231,750, mailed Feb. 7, 2013.

* cited by examiner

*Primary Examiner* — George Fourson, III
*Assistant Examiner* — Wilner Jean Baptiste
(74) *Attorney, Agent, or Firm* — Ingrassia Fisher & Lorenz, P.C.

(57) ABSTRACT

Methods are provided for forming semiconductor devices. One method includes etching trenches into a silicon substrate and filling the trenches with an insulating material to delineate a plurality of spaced apart silicon fins. Dummy gate structures are formed, which includes a first dummy gate structure, that overlie and are transverse to the fins. A back fill material is filled between the dummy gate structures. The first dummy gate structure and an upper portion of the insulating material are removed to expose an active fins portion of the fins. The active fins portion is dimensionally modified to form an altered active fins portion. A high-k dielectric material and a work function determining gate electrode material are deposited overlying the altered active fins portion.

20 Claims, 11 Drawing Sheets

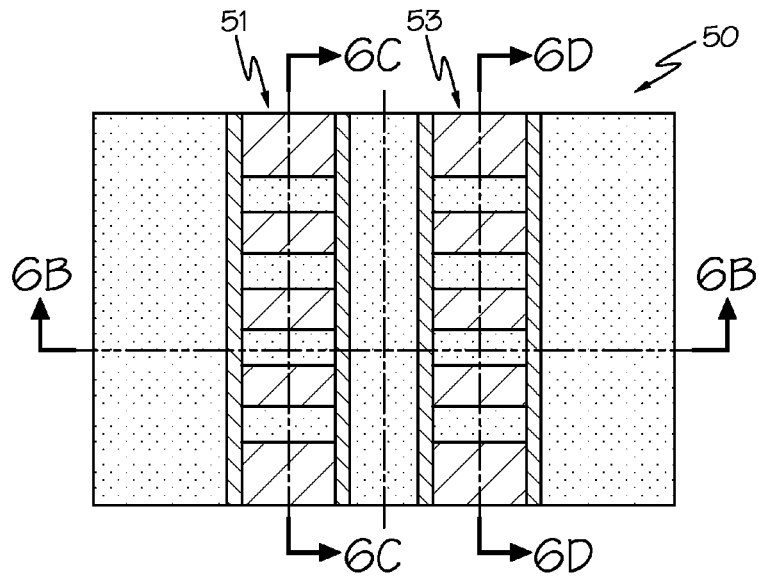
FIG. 6A
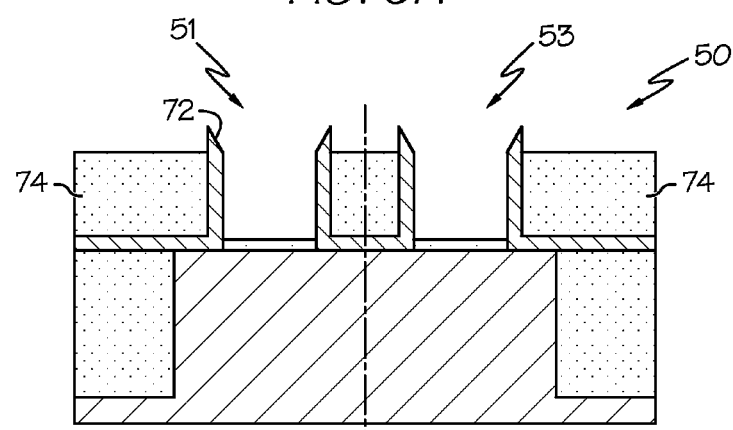
FIG. 6B
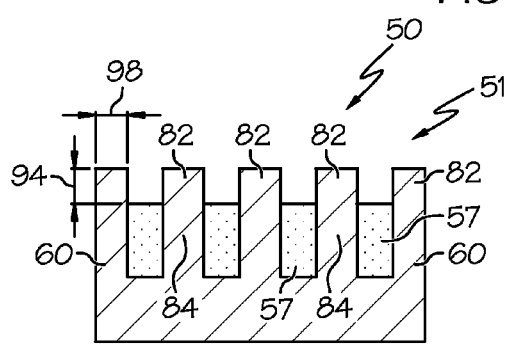 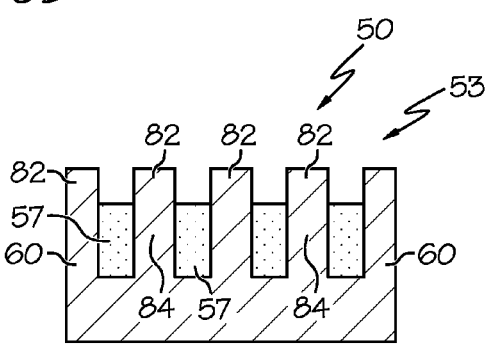
FIG. 6C  FIG. 6D

METHODS FOR FORMING SEMICONDUCTOR DEVICES

TECHNICAL FIELD

The present invention relates generally to methods for forming semiconductor devices, and more particularly relates to methods for forming semiconductor devices having FINFET type transistors with dimensionally different fins.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the dual goals of reducing transistor size while maintaining transistor performance. The FINFET is a three dimensional transistor formed in a thin fin that extends upwardly from a semiconductor substrate. Transistor performance, often measured by its transconductance, is proportional to the width of the transistor channel. In a FINFET, the transistor channel is formed at least along the vertical sidewalls of the fin, so a wide channel, and hence high performance, can be achieved without substantially increasing the area of the substrate surface required by the transistor. Additionally, the threshold voltage of a FINFET, which is basically the minimum gate voltage necessary to turn the transistor "ON," is also a function of the width of the transistor channel and therefore, is determined at least in part by the dimensions of the fin (e.g. height of the fin's vertical sidewalls).

Design and performance requirements vary for a variety of different IC applications. It would be desirable for some of these applications to have the flexibility to form semiconductor ICs having FINFET type transistors with multiple threshold voltages and varying transistor performance. Unfortunately, current methods for fabricating semiconductor ICs with FINFET type transistors often do not lend themselves towards forming dimensionally different fins.

Accordingly, it is desirable to provide methods for forming semiconductor devices that include FINFET type transistors with dimensionally different fins to provide multiple threshold voltages and/or varying transistor performance. Furthermore, other desirable features and characteristics of the present invention will become apparent from the subsequent detailed description and the appended claims, taken in conjunction with the accompanying drawings and the foregoing technical field and background.

BRIEF SUMMARY

Methods for forming semiconductor devices are provided herein. In accordance with an exemplary embodiment, a method for forming a semiconductor device includes etching a plurality of trenches into a silicon substrate and filling the plurality of trenches with an insulating material to delineate a plurality of spaced apart silicon fins. Dummy gate structures are formed that overlie and are transverse to the plurality of spaced apart silicon fins. Forming the dummy gate structures includes forming a first dummy gate structure. A back fill material is filled between the dummy gate structures. The first dummy gate structure and a first upper portion of the insulating material are removed to expose a first active fins portion of the plurality of spaced apart silicon fins. The first active fins portion is dimensionally modified to form a first altered active fins portion. A first quantity of high-k dielectric material and a second quantity of work function determining gate electrode material are deposited overlying the first altered active fins portion. The work function determining gate electrode material overlies the high-k dielectric material.

In accordance with another exemplary embodiment, a method for forming a semiconductor device is provided. The method includes etching a plurality of trenches into a silicon substrate and filling the plurality of trenches with an insulating material to delineate a plurality of spaced apart silicon fins. Dummy gate structures are formed that overlie and are transverse to the plurality of spaced apart silicon fins. Forming the dummy gate structures includes forming a first dummy gate structure spaced apart from a second dummy gate structure. A back fill material is filled between the first and second dummy gate structures. The first and second dummy gate structures are removed to expose a first upper portion and a second upper portion of the insulating material, respectively. The first and second upper portions of the insulating material are removed to expose a first active fins portion and a second active fins portion of the plurality of spaced apart silicon fins, respectively. A first mask layer is formed overlying the second active fins portion. The first active fins portion is dimensionally modified including increasing a first height of the first active fins portion, thinning the first active fins portion, or a combination thereof to form a first altered active fins portion. The first altered active fins portion is dimensionally different than the second active fins portion. A first quantity of high-k dielectric material and a second quantity of work function determining gate electrode material are deposited overlying the first altered active fins portion. The work function determining gate electrode material overlies the high-k dielectric material.

In accordance with another exemplary embodiment, a method for forming a semiconductor device is provided. The method includes etching a plurality of trenches into a silicon substrate and filling the plurality of trenches with an insulating material to delineate a plurality of spaced apart silicon fins. Dummy gate structures are formed that overlie and are transverse to the plurality of spaced apart silicon fins. Forming the dummy gate structures includes forming a first dummy gate structure spaced apart from a second dummy gate structure. A back fill material is filled between the first and second dummy gate structures. The first and second dummy gate structures are removed to expose a first upper portion and a second upper portion of the insulating material, respectively. Ions are implanted into the first and second upper portions of the insulating material to form a first doped upper portion and a second doped upper portion, respectively. The first and second doped upper portions of the insulating material have higher etch rates than a lower portion of the insulating material. The first and second doped upper portions are etched to expose a first active fins portion and a second active fins portion of the plurality of spaced apart silicon fins, respectively. A first mask layer is formed overlying the second active fins portion. The first active fins portion is dimensionally modified to form a first altered active fins portion that is dimensionally different than the second active fins portion. A first quantity of high-k dielectric material and a second quantity of work function determining gate electrode material are deposited overlying the first altered active fins portion. The work function determining gate electrode material overlies the high-k dielectric material.

BRIEF DESCRIPTION OF THE DRAWINGS

The present invention will hereinafter be described in conjunction with the following drawing figures, wherein like numerals denote like elements.

FIGS. 2A-10D illustrate methods for forming semiconductor devices in accordance with various embodiments. FIGS. 2A, 3A, 4A, 5A, 6A, 7A, 8A, 9A, and 10A illustrate the semiconductor device in plan view during stages of its fabrication; and FIGS. 2B, 3B-3C, 4B-4C, 5B-5D, 6B-6D, 7B-7D, 8B-8D, 9B-9D, and 10B-10D illustrate the semiconductor device in cross sectional view during stages of its fabrication.

DETAILED DESCRIPTION

The following Detailed Description is merely exemplary in nature and is not intended to limit the invention or the application and uses of the invention. Furthermore, there is no intention to be bound by any theory presented in the preceding background or the following detailed description.

Semiconductor devices (or ICs) can be designed with millions of transistors. Many semiconductor devices are designed using metal oxide semiconductor (MOS) transistors, also known as field effect transistors (FETs) or MOSFETs. Although the term "MOS transistor" properly refers to a device having a metal gate electrode and an oxide gate insulator, that term used herein refers to any device that includes a conductive gate electrode (whether metal or other conductive material) that is positioned over a gate insulator (whether oxide or other insulator) which, in turn, is positioned over a semiconductor substrate. One type of MOS transistor used in the design of semiconductor devices is a FINFET, which can be fabricated as a P-channel transistor or as a N-channel transistor, and can also be fabricated with or without mobility enhancing stress features. A circuit designer can mix and match device types, using P-channel and N-channel, FINFET and other types of MOS transistors, stressed and unstressed, to take advantage of the best characteristics of each device type as they best suit the circuit being designed.

Figure 1:
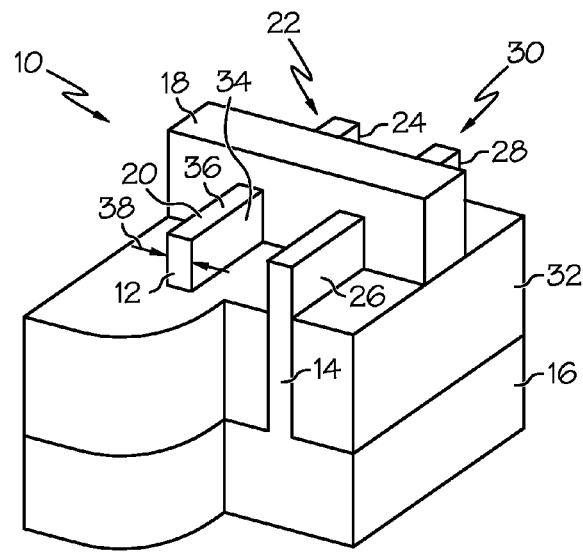
FIG. 1 illustrates a FINFET in a partially cut away perspective view.

The following brief explanation is provided to identify some of the unique features of FINFET. FIG. 1 illustrates, in a cut away perspective view, a portion of a FINFET semiconductor device 10. As illustrated, the semiconductor device 10 includes two fins 12 and 14 that are formed from and extend upwardly from a bulk semiconductor substrate 16. A gate electrode 18 overlies the two fins 12 and 14 and is electrically insulated from the fins 12 and 14 by a gate insulator (not illustrated). An end 20 of the fin 12 is appropriately impurity doped to form a source of a FET 22, and an end 24 of the fin 12 is appropriately impurity doped to form a drain of the FET 22. Similarly, the ends 26 and 28 of the fin 14 form the source and drain, respectively, of another FET 30.

The illustrated portion of semiconductor device 10 thus includes two FINFETs 22 and 30 having a common gate electrode 18. In another configuration, if the ends 20 and 26 that form the sources are electrically coupled together and the ends 24 and 28 that form the drains are electrically coupled together, the structure would be a two-fin FINFET having twice the gate width of either FET 22 or 30. An oxide layer 32 forms electrical isolation between the fins 12 and 14 and between adjacent devices as is needed for the circuit being implemented. The channel of the FINFET 22 extends along a sidewall 34 of the fin 12 beneath the gate electrode 18, along a top 36 of the fin 12, as well as along an opposite sidewall not visible in this perspective view. The advantage of the FINFET structure is that although the fin 12 has only the narrow width represented by the arrows 38, the channel has a width represented by at least twice the height of the fin 12 above the oxide layer 32. The channel width thus can be much greater than fin width.

FIGS. 2A-10D illustrate methods for forming a semiconductor device 50 in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portion of the semiconductor device 50 includes FINFETs 52 and FINFETs 54 (see FIGS. 10C-10D), which are each similar to the FINFETs 22 and 30 described above. It will be appreciated that the various embodiments contemplated herein can include a large number of such FINFETs 52 and 54. The initial steps described below relate specifically to the fabrication of the FINFETs 52 and 54, which can be N-channel transistors, P-channel transistors, or combinations of N- and P-channel transistors. Various steps in the manufacture of ICs are well known and so, in the interest of brevity, many conventional steps will only be mentioned briefly herein or will be omitted entirely without providing the well known process details.

Figure 2A:
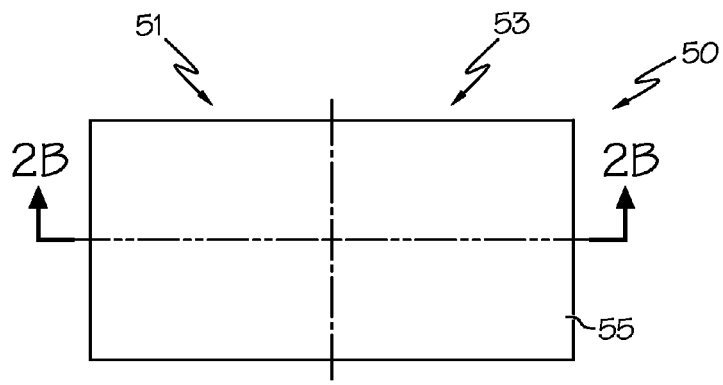
Figure 2B:
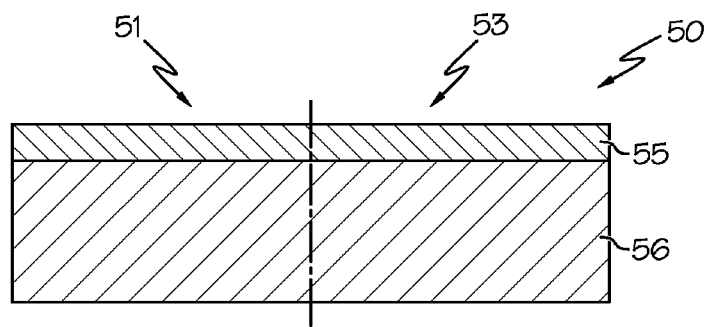

Referring to FIGS. 2A-2B, a portion of a semiconductor device 50 is illustrated at an early stage of fabrication. The semiconductor device 50 includes a first device area 51 in which the FINFETs 52 (see FIG. 10C) will be formed, and a second device area 53 in which the FINFETs 54 (see FIG. 10D) will be formed. The first and second device areas 51 and 53 may be disposed adjacent to each other or alternatively, may be positioned remotely from each other. The semiconductor device 50 has a hard mask 55 (e.g. nitride cap) for patterning overlying a bulk semiconductor wafer 56. The bulk semiconductor wafer 56 can be silicon, silicon admixed with germanium or carbon, or other semiconductor materials commonly used in the fabrication of ICs, but for simplicity will herein be referred to simply as a silicon substrate.

Figure 3A:
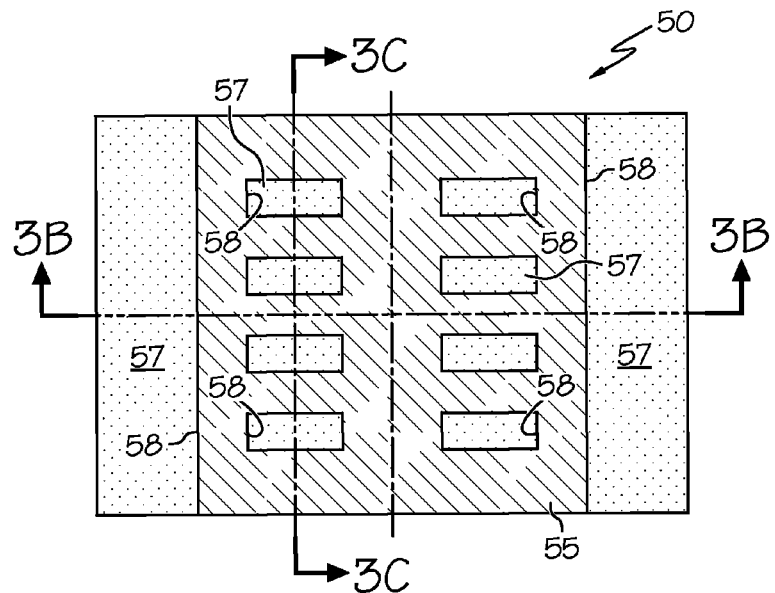
Figure 3B:
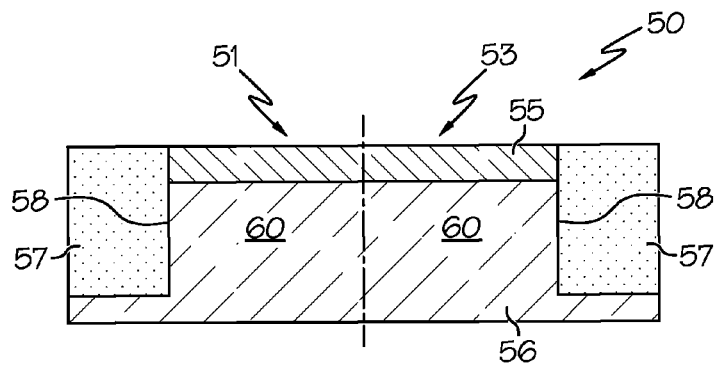
Figure 3C:
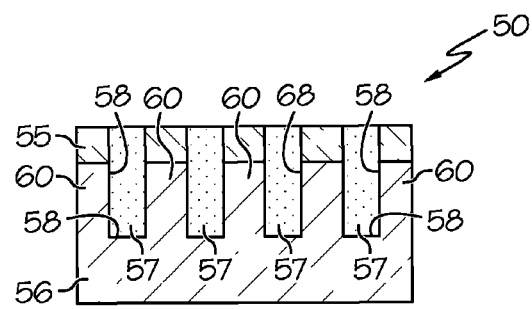

Referring to FIGS. 3A-3C, the semiconductor device 50 is illustrated at a further advanced fabrication stage in accordance with an exemplary embodiment. As shown, a plurality of trenches 58 formed into the bulk semiconductor wafer 56 are filled with an insulating material 57. The insulating material 57 can be, for example, part of shallow trench isolation (STI) structures that separates the first and second device areas 51 and 53 from other device areas of the semiconductor device 50 and/or from each other (e.g. not shown, but if the first and second device areas 51 and 53 are adjacent areas, then these areas 51 and 53 will be separated by a STI structure). STI, as is well known, includes a trench that is etched into the bulk semiconductor wafer 56 and is subsequently filled with an oxide or other insulating material. The insulating material 57 also separates and delineates a plurality of silicon fins 60 in both the first and second device areas 51 and 53. The silicon fins 60 are not exposed at this point in the processing, but rather are exposed later as is explained in detail below. After formation of the STI structures and the silicon fins 60 involving lithography, etching, deposition, planarization techniques such as chemical mechanical planarization (CMP), and the like, the remaining portion of the hard mask 55 is stripped and basic doping of the first and second device areas 51 and 53 may be established, for instance, by ion implantation. Alternatively, the basic doping of the first and second device areas 51 and 53 may be established prior to the deposition of the hard mask 55, and the formation of the STI structures and the silicon fins 60.

In an exemplary embodiment, basic doping of the first and second device areas 51 and 53 is established using conductivity determining dopant impurities that are implanted into bulk semiconductor wafer 56 to form well implants (not shown). The well implants may be doped with N-type dopant impurities, such as arsenic or phosphorus, to form P-channel FINFETs, or may be doped with P-type dopant impurities, such as boron, to form N-channel FINFETs. Areas that are not to be implanted during the well implantation step can be masked, for example, with a patterned layer of photoresist. Multiple implants may be used to tailor the implant dose and dopant profile.

Figure 4A:
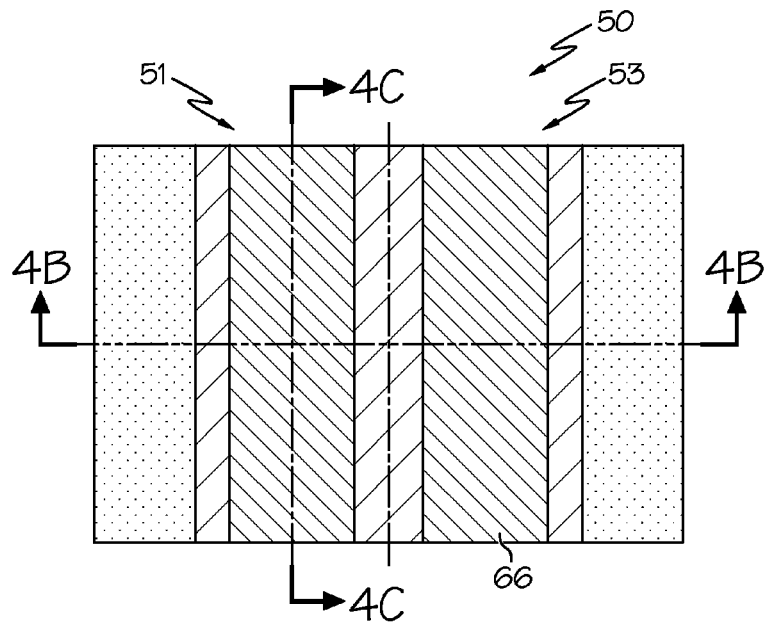
Figure 4B:
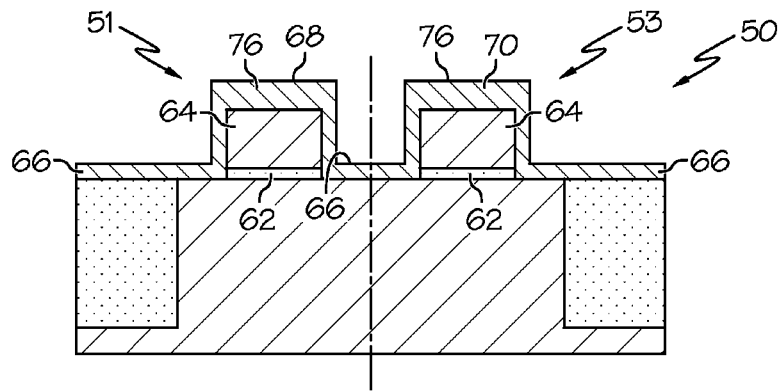
Figure 4C:
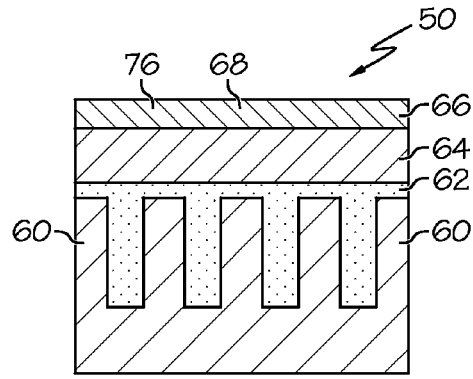
Figure 5A:
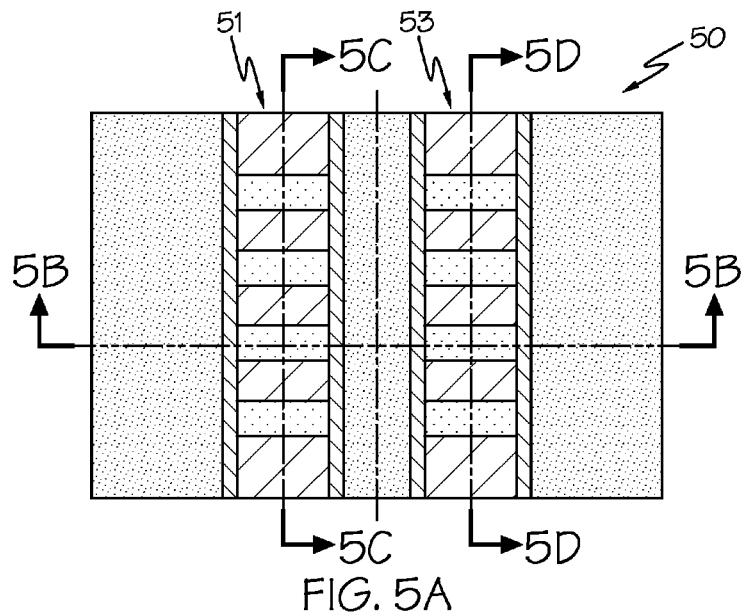
Figure 5B:
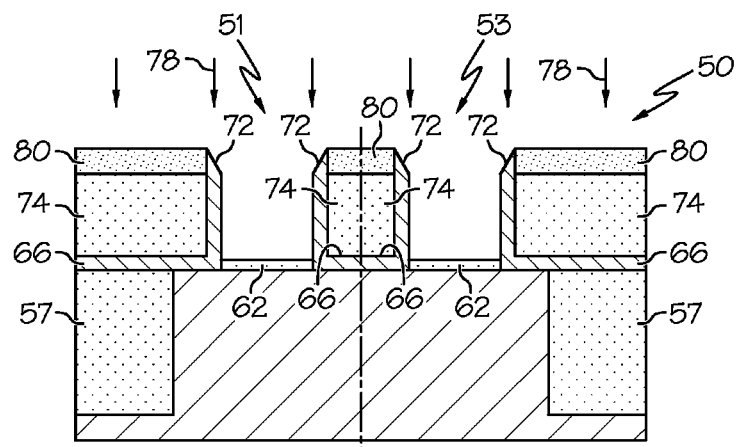
Figure 5C:
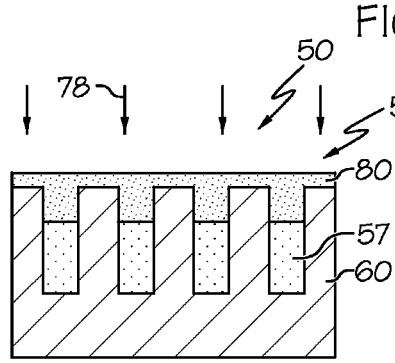
Figure 5D:
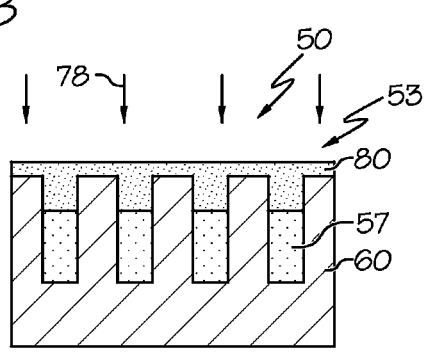
Figure 7A:
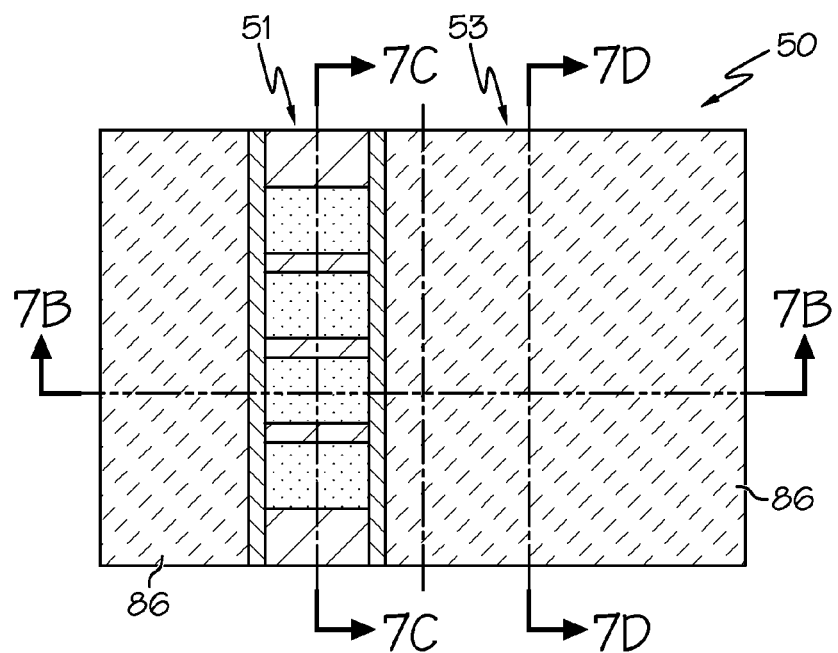
Figure 7B:
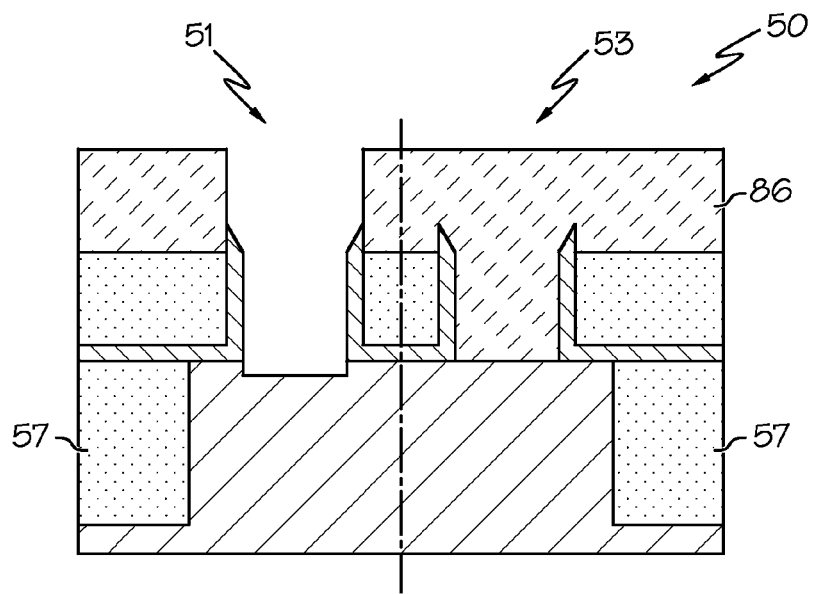
Figure 7C:
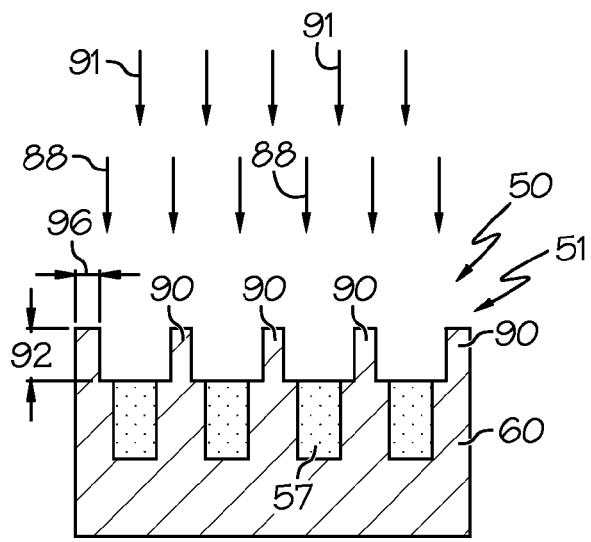
Figure 7D:
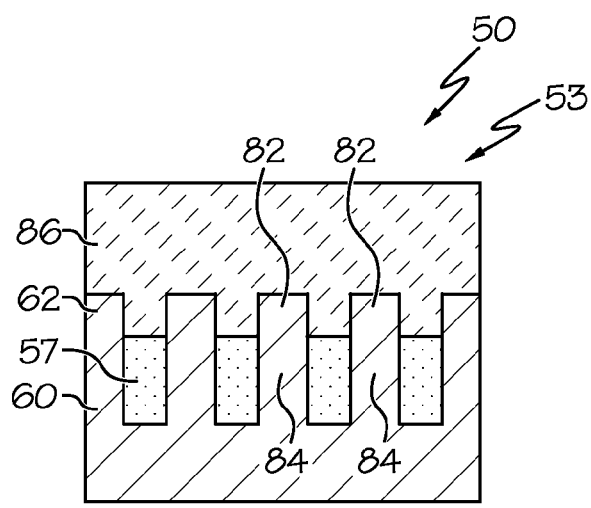
Figure 8A:
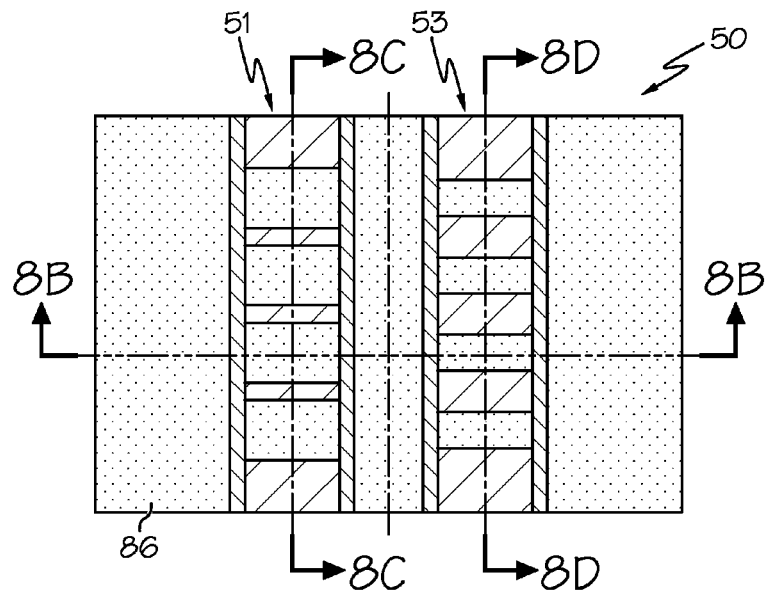
Figure 8B:
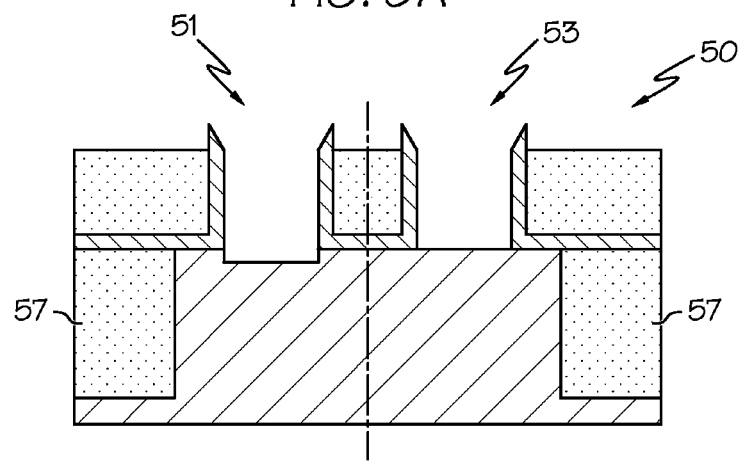
Figure 8C:
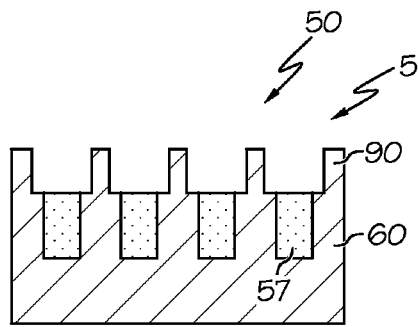
Figure 8D:
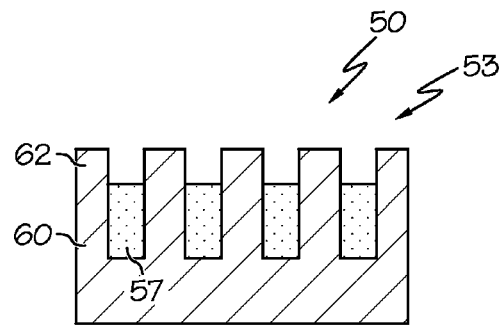
Figure 9A:
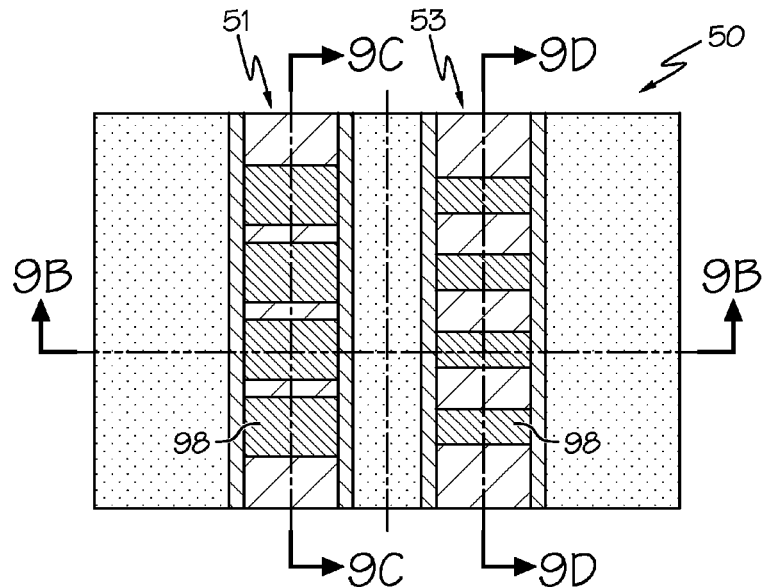
Figure 9B:
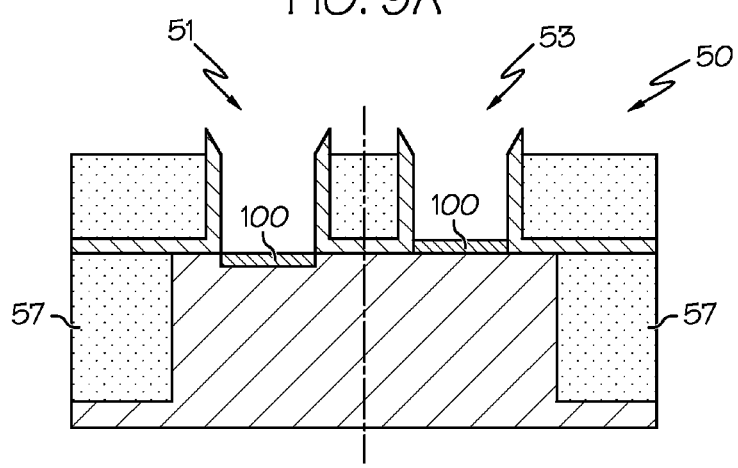
Figure 9C:
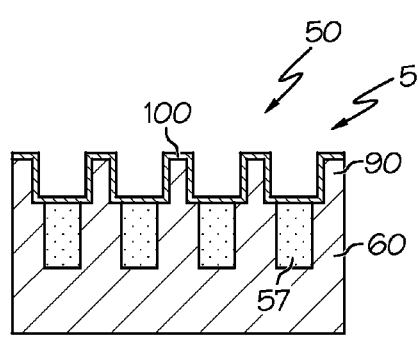
Figure 9D:
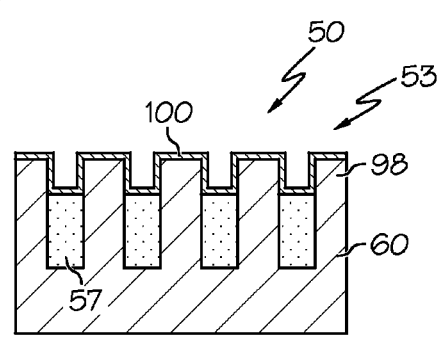
Figure 10A:
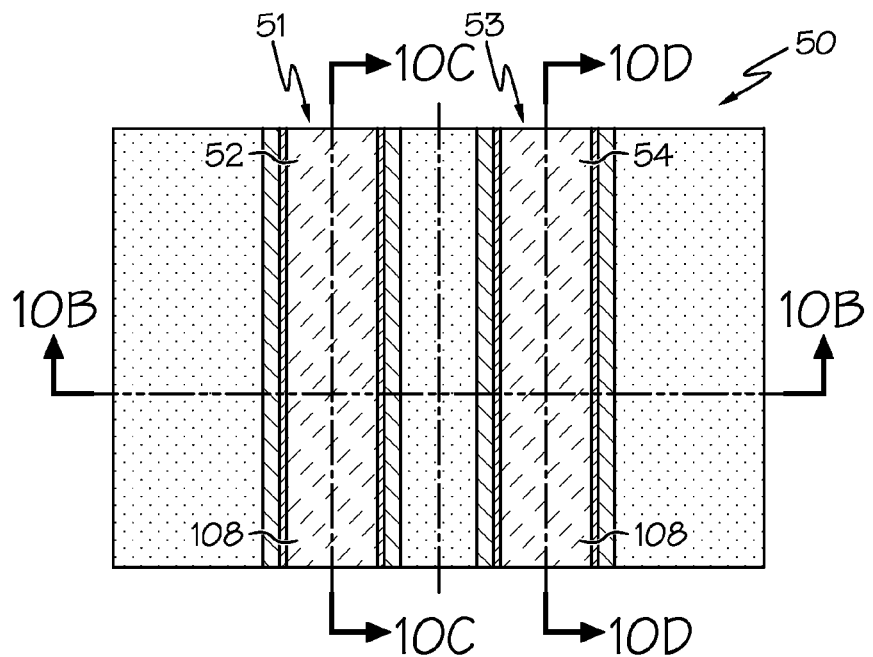
Figure 10B:
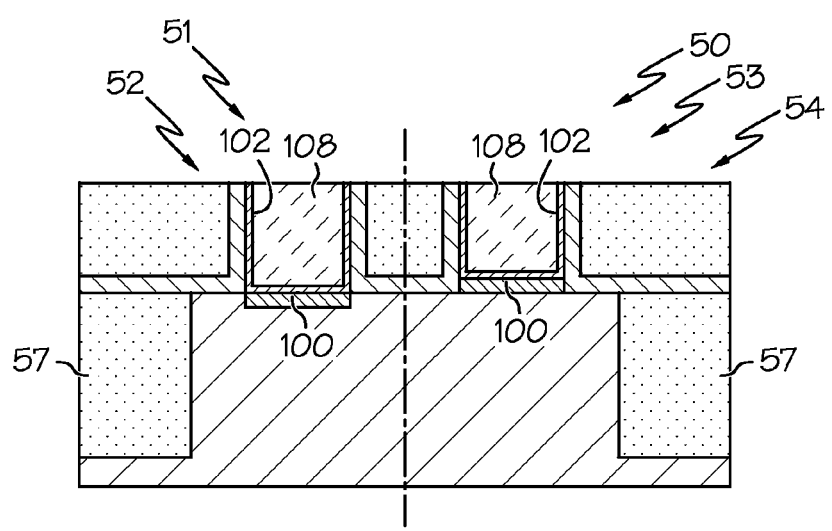
Figure 10C:
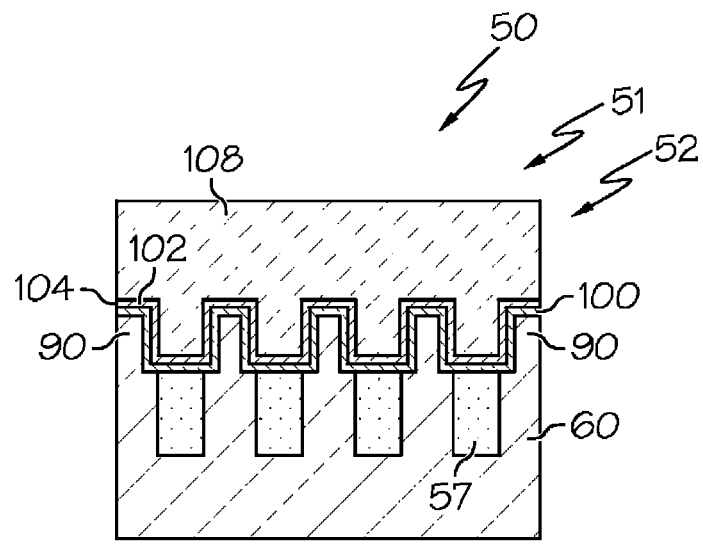
Figure 10D:
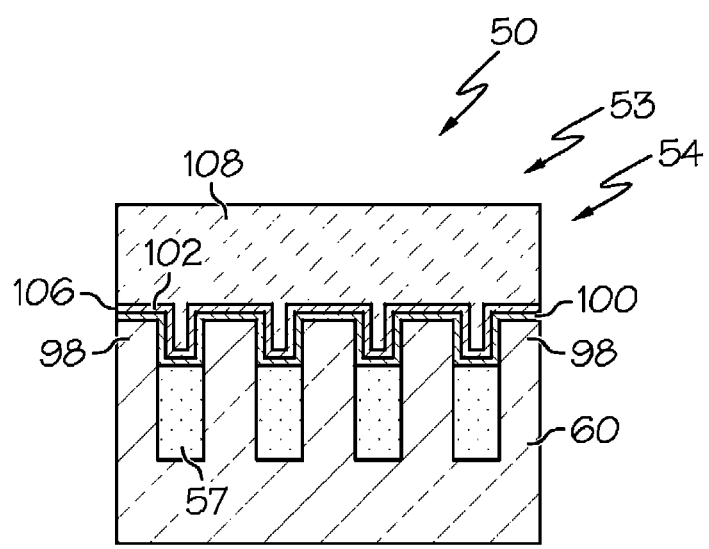

The method continues as illustrated in FIGS. 4A-4C, in accordance with an exemplary embodiment, by the deposition of a dummy gate oxide insulator layer 62, a layer of dummy gate electrode material 64, and a capping layer 66. Each of the layers 62, 64, and 66 can be deposited, for example, by chemical vapor deposition (CVD), low pressure chemical vapor deposition (LPCVD), or plasma enhanced chemical vapor deposition (PECVD). The dummy gate oxide insulator layer 62 can be, for example, a layer of silicon oxide or other gate oxide material having a thickness of about 1.5 to about 5 nm (the gate oxide can as well be a sacrificial gate oxide and may be quite thick); the layer of dummy gate electrode material 64 can be a layer of polycrystalline silicon, amorphous silicon germanium, amorphous silicon, or the like having a thickness of about 50 to about 60 nm; and the capping layer 66 can be a layer of silicon nitride or other hard mask material having a thickness of about 40 nm. Instead of being deposited, the layer of dummy gate electrode material 64 can be thermally grown. The layers 62, 64, and 66 are photolithographically patterned and etched to form the first and second dummy gate structures 68 and 70. After formation of the first and second dummy gate structures 68 and 70, sidewall spacers 72 are formed on the sidewalls of the dummy gate structures 68 and 70 (see FIGS. 5A-5B showing sidewall spacers after partial removal of the first and second dummy gate structures 68 and 70).

The first and second dummy gate structures 68 and 70 serve as placeholders for active gates that are to be formed by a replacement gate process as described below. Notably, the first and second dummy gate structures 68 and 70 allow the silicon fins 60 to be revealed at a later fabrication stage for formation of the active gates, allowing all of the prior processing steps to be carried out on a substantially planar upper surface of the semiconductor wafer. If the silicon fins 60 are revealed early, as is conventional, processing must be done in three dimensions which is much more difficult.

Although not illustrated in any of the FIGURES to avoid confusing the drawings, source and drain regions are formed in a conventional manner by the implantation of conductivity determining ions. For example, ions are implanted into the silicon fins 60 using the dummy gate structures 68 and 70 as ion implantation masks so as to self align the source and drain regions to the gate and underlying channel. The P-channel source and drains can be formed by implanting boron ions. The N-channel source and drains can be formed by implanting arsenic or phosphorus ions. Source and drain extensions may also be formed in a conventional manner.

Referring to FIGS. 5A-5D, the semiconductor device 50 is illustrated at a further advanced fabrication stage in accordance with an exemplary embodiment. As shown, a layer of back fill material 74, such as silicon oxide or the like, is deposited over the capping layer 66. The layer of back fill material 74 is planarized, for example by CMP, with the planarization stopping on uppermost portions 76 (see FIGS. 4B-4C) of the capping layer 66 arranged along the tops of the first and second dummy gate structures 68 and 70. The layer of back fill material 74 serves as a self align dummy contact for forming contacts or as a dummy back fill, self aligned and spaced apart from the dummy gate structures 68 and 70.

In accordance with an exemplary embodiment, the first and second dummy gate structures 68 and 70 are replaced (e.g. via a gate replacement process) by removing the uppermost portions 76 (see FIGS. 4B-4C) of the capping layer 66 to expose the layer of dummy gate electrode material 64 of the dummy gate structures 68 and 70 (see FIG. 4B). The uppermost portions 76 of the capping layer 66 may be removed by an etchant that is selective so as to etch the nitride capping material without etching the layer of dummy gate electrode material 64 and the layer of back fill material 74 (or by any polish process). The layer of dummy gate electrode material 64 is then removed, such as, for example, by a dry or wet etching process.

Optionally, the dummy gate oxide material layers 62, upper portions of the insulating material 57, and upper portions of the layer of back fill material 74 are doped with ions, such as Xe ions, Ge ions, and/or F ions, via a blanket ion implantation process 78 to form doped upper portions 80. Doping these oxide materials 62, 57, and 74 with ions increases the etch rates of the oxides so that the doped upper portions 80 can be selectively removed more easily.

Referring to FIGS. 6A-6D, the semiconductor device 50 is illustrated at a further advanced fabrication stage in accordance with an exemplary embodiment. The doped upper portions 80 are etched back via a dry etching process, such as a reactive ion etching process, or via a wet etching process to expose the top portions 82 (i.e. active portions) of the silicon fins 60 while the lower portions 84 of the silicon fins 60 remain covered by the insulating material 57. In one example, the doped upper portions 80 are etched back using a relatively dilute wet etchant such that the doped upper portions 80 are removed while the lower undoped portions of the oxide materials 62, 57, and 74 effectively act as an etching stop. As will be discussed in further detail below, the exposed portions of the silicon fins 60 will subsequently be electrically insulated and covered by a gate electrode material and thereby form the active portions of the silicon fins 60 while the portions of the silicon fins 60 (see FIG. 6D) that remain covered by the insulating material 57 form the inactive portions of the silicon fins 60.

The method continues as illustrated in FIGS. 7A-7D, in accordance with an exemplary embodiment, by the deposition of a mask layer 86 (e.g. hard mask material, photoresist, or the like). The mask layer 86 is patterned so that the top portions 82 of the silicon fins 60 (see FIG. 6C) arranged along the first device area 51 are exposed while the top portions 82 of the silicon fins 60 arranged along the second device area 53 are covered by the mask layer 86.

Optionally, an ion implantation process 88 may be used to implant ions, such as Xe ions, Ge ions, and/or F ions, into the exposed areas of the remaining insulating material 57 (see FIG. 6C) that are disposed between the silicon fins 60 of the first device area 51. The implanted ions increase the etch rate of the upper remaining portion of the insulating material 57.

In an exemplary embodiment, the active or top portions 82 of the silicon fins 60 arranged along the first device area 51 are dimensionally modified using an etching process 91 to form first altered active fins portions 90 while the second device area 53 is covered by the mask layer 86. In one example, the upper remaining portion of the insulating material 57 is removed via an anisotropic dry or wet etching process to form the first altered active fins portions 90 having a first altered height indicated by double headed arrow 92 that is greater than the first original height indicated by double headed arrow 94 illustrated in FIG. 6C. Alternatively or in addition to increasing the height of the active fins portions, the top portions 82 of the silicon fins 60 arranged along the first device area 51 are dimensionally modified using an isotropic etching process to form the first altered active fins portion 90 having a first altered width indicated by single headed arrows 96 that is less (e.g. thinner) than the first original width indicated by double headed arrow 98 (see FIG. 6C). As illustrated, the first altered active fins portion 90 are dimensionally different than the top portions 82 of the silicon fins 60 arranged along the second device area 53.

Referring to FIGS. 8A-8D, the semiconductor device 50 is illustrated at a further advanced fabrication stage in accordance with an exemplary embodiment. The mask layer 86 (see FIG. 7B) is removed to expose both the first and second device areas 51 and 53. Optionally, a similar masking step and dimensional modification step either with or without the ion implantation process 88 may be conducted on the second device area 53 similarly as described for the first device area 51 to dimensionally modify the top portions 82 of the silicon fins 60 arranged along the second device area 53 to form the second altered active fins portion 98 (see FIG. 8D). As illustrated, the first and second altered active fins portions 90 and 98 are dimensionally distinct from each other. Optionally, either before removing the mask layer 86 or thereafter, the first altered active fins portion 90 and/or the second altered active fins portion 98 may be doped by an additional ion implantation process, which can be used to further adjust or tune the threshold voltages of the transistors.

The method continues as illustrated in FIGS. 9A-9D, in accordance with an exemplary embodiment, by cleaning the exposed surfaces (e.g. the first altered active fins portion 90 and the second altered (or unaltered) active fins portion 98) of the silicon fins 60, and depositing a high dielectric constant (high-k) gate insulator layer 100, such as zirconium oxide, hafnium oxide, hafnium aluminum oxide, and the like. As illustrated in FIGS. 10A-10D, a layer of work function determining material 102 is formed overlying the high dielectric constant gate insulator material 100 to form the gate wrap-arounds 104 and 106 corresponding to the FINFETS 52 and 54. For a P-channel MOS transistor, the work function determining material 102 can be, for example, titanium nitride. A different work function determining material 102 such as titanium aluminum nitride can be used on the N-channel MOS transistors. After formation of the gate wrap-arounds 104 and 106 involving deposition of a cap layer, for example, TiN (not shown) over the high dielectric constant gate insulator material 100, patterned masking, selective removal of the cap layer, and selective deposition of the work function determining material(s) 102 for P-channel MOS transistors and/or N-channel MOS transistors, a metal fill 108 is deposited and planarized, for example by CMP. In one example, the metal fill 108 is aluminum.

As illustrated, the FINFETs 52 and FINFETs 54 include active fins portions (e.g. the first altered active fins portion 90 and the second altered (or unaltered) active fins portion 98) that are dimensionally different from each other. The gate wrap-arounds 104 and 106 overlie the corresponding active fins portions and are isolated from these active portions by the high dielectric constant gate insulator layer(s) 100 such that the FINFETs 52 and the FINFETs 54 have different transistor channel widths. In an exemplary embodiment, the transistor channel width for each of the transistors of the FINFETs 52 corresponds to twice the height plus the width of one of the first altered active fins portion 90, and the transistor channel width for each of the transistors of the FINFETs 54 correspond to twice the height plus the width of one of the second altered (or unaltered) active fins portion 98. Therefore, because the transistor channel widths of the transistors of the FINFETs 52 are different than the transistor channel widths of the transistors of the FINFETs 54, the semiconductor device 50 includes FINFET type of transistors with different threshold voltages and varying transistor performance (i.e., the drive currents are higher for the wider devices+smaller fins can be controlled much more efficient than wide fins, i.e., the devices with narrower fins can be switched easier).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for forming a semiconductor device, the method comprising:
    etching a plurality of trenches into a silicon substrate and filling the plurality of trenches with an insulating material to delineate a plurality of spaced apart silicon fins;
    forming dummy gate structures overlying and transverse to the plurality of spaced apart silicon fins including forming a first dummy gate structure;
    filling between the dummy gate structures with a back fill material;
    removing the first dummy gate structure and a first upper portion of the insulating material to expose a first active fins portion of the plurality of spaced apart silicon fins;
    dimensionally modifying the first active fins portion to form a first altered active fins portion; and
    depositing a first quantity of high-k dielectric material and a second quantity of work function determining gate electrode material overlying the first altered active fins portion, wherein the work function determining gate electrode material overlies the high-k dielectric material.

2. The method of claim 1, wherein forming the dummy gate structures comprises:
    forming a layer of insulator overlying the plurality of spaced apart silicon fins;
    forming a layer of dummy gate electrode material overlying the layer of insulator;
    forming a layer of hard mask material overlying the layer of dummy gate electrode material;
    patterning the layer of hard mask material, the layer of dummy gate electrode material, and the layer of insulator to form dummy gate stacks; and
    forming sidewall spacers on the dummy gate stacks.

3. The method of claim 2, wherein filling between the dummy gate structures comprises:
    depositing the back fill material between adjacent ones of the dummy gate stacks; and planarizing the back fill material by chemical mechanical planarization.

4. The method of claim 1, wherein removing the first dummy gate structure and the first upper portion of the insulating material comprises:
implanting ions into the first upper portion of the insulating material after removing the first dummy gate structure to form a first doped upper portion that has a higher etch rate than a lower portion of the insulating material; and
etching the first doped upper portion to expose the first active fins portion.

5. The method of claim 4, wherein implanting ions comprises:
implanting ions selected from the group consisting of Xe, Ge, F, and combinations thereof into the first upper portion.

6. The method of claim 4, wherein etching the first doped upper portion comprises:
etching the first doped upper portion using a wet etching process or a dry etching process.

7. The method of claim 1, wherein dimensionally modifying the first active fins portion comprises:
increasing a height of the first active fins portion to form the first altered active fins portion.

8. The method of claim 7, wherein increasing the height comprises;
removing a first incremental portion of the insulating material that is proximate the first active fins portion to expose a first lower portion of the plurality of spaced apart silicon fins.

9. The method of claim 1, wherein dimensionally modifying the first active fins portion comprises:
removing a portion of the first active fins portion to form the first altered active fins portion.

10. The method of claim 9, wherein removing the portion of the first active fins portion comprises:
thinning the first active fins portion to form the first altered active fins portion.

11. The method of claim 1, wherein dimensionally modifying the first active fins portion comprises:
implanting ions into a first incremental portion of the insulating material to form a first doped incremental portion that overlies and has a higher etch rate than a lower portion of the insulating material; and
etching the first doped incremental portion to expose the lower portion of the insulating material and form the first altered active fins portion.

12. The method of claim 1, further comprising:
implanting ions of a conductivity determining type into the first altered active fins portion prior to depositing the first quantity of high-k dielectric material and the second quantity of work function determining gate electrode material.

13. The method of claim 1, wherein forming the dummy gate structures comprises forming a second dummy gate structure that is spaced apart from the first dummy gate structure, and wherein filling between the dummy gate structures comprises filling between the first and second dummy gate structures with the back fill material, and wherein the method further comprises:
removing the second dummy gate structure and a second upper portion of the insulating material to expose a second active fins portion of the plurality of spaced apart silicon fins.

14. The method of claim 13, further comprising:
dimensionally modifying the second active fins portion to form a second altered active fins portion that is dimensionally different than the first altered active fins portion; and
depositing a third quantity of high-k dielectric material and a fourth quantity of work function determining gate electrode material overlying the second altered active fins portion.

15. The method of claim 13, wherein removing the second dummy gate structure and the second upper portion of the insulating material comprises exposing the second active fins portion that is dimensionally different than the first altered active fins portion, and wherein the method further comprises:
depositing a third quantity of high-k dielectric material and a fourth quantity of work function determining gate electrode material overlying the second active fins portion.

16. A method for forming a semiconductor device, the method comprising:
etching a plurality of trenches into a silicon substrate and filling the plurality of trenches with an insulating material to delineate a plurality of spaced apart silicon fins;
forming dummy gate structures overlying and transverse to the plurality of spaced apart silicon fins including forming a first dummy gate structure spaced apart from a second dummy gate structure;
filling between the first and second dummy gate structures with a back fill material;
removing the first and second dummy gate structures to expose a first upper portion and a second upper portion of the insulating material, respectively;
removing the first and second upper portions of the insulating material to expose a first active fins portion and a second active fins portion of the plurality of spaced apart silicon fins, respectively;
forming a first mask layer overlying the second active fins portion;
dimensionally modifying the first active fins portion comprising:
increasing a first height of the first active fins portion, thinning the first active fins portion, or a combination thereof to form a first altered active fins portion that is dimensionally different than the second active fins portion; and
depositing a first quantity of high-k dielectric material and a second quantity of work function determining gate electrode material overlying the first altered active fins portion, wherein the work function determining gate electrode material overlies the high-k dielectric material.

17. The method of claim 16, further comprising:
implanting ions of a conductivity determining type into the first altered active fins portion prior to depositing the first quantity of high-k dielectric material and the second quantity of work function determining gate electrode material.

18. The method of claim 16, further comprising:
removing the first mask layer;
forming a second mask layer overlying the first altered active fins portion;
dimensionally modifying the second active fins portion comprising:
increasing a second height of the second active fins portion, thinning the second active fins portion, or a combination thereof to form a second altered active fins portion that is dimensionally different than the first altered active fins portion; and depositing a third quantity of high-k dielectric material and a fourth quantity of work function determining gate electrode material overlying the second altered active fins portion.

19. The method of claim 18, further comprising:

implanting ions of a conductivity determining type into the second altered active fins portion prior to depositing the third quantity of high-k dielectric material and the fourth quantity of work function determining gate electrode material.

20. A method for forming a semiconductor device, the method comprising:

etching a plurality of trenches into a silicon substrate and filling the plurality of trenches with an insulating material to delineate a plurality of spaced apart silicon fins;

forming dummy gate structures overlying and transverse to the plurality of spaced apart silicon fins including forming a first dummy gate structure spaced apart from a second dummy gate structure;

filling between the first and second dummy gate structures with a back fill material;

removing the first and second dummy gate structures to expose a first upper portion and a second upper portion of the insulating material, respectively;

implanting ions into the first and second upper portions of the insulating material to form a first doped upper portion and a second doped upper portion, respectively, wherein the first and second doped upper portions of the insulating material have higher etch rates than a lower portion of the insulating material;

etching the first and second doped upper portions to expose a first active fins portion and a second active fins portion of the plurality of spaced apart silicon fins, respectively;

forming a first mask layer overlying the second active fins portion;

dimensionally modifying the first active fins portion to form a first altered active fins portion that is dimensionally different than the second active fins portion; and depositing a first quantity of high-k dielectric material and a second quantity of work function determining gate electrode material overlying the first altered active fins portion, wherein the work function determining gate electrode material overlies the high-k dielectric material.

* * * * *